United States Patent

Yamamoto et al.

[11] Patent Number: 6,038,242
[45] Date of Patent: Mar. 14, 2000

[54] MULTIWAVELENGTH LIGHT SOURCE

[75] Inventors: Tsuyoshi Yamamoto; Haruhiko Tabuchi; Goji Nakagawa; Yousuke Yamazaki, all of Kawasaki, Japan

[73] Assignee: Fujitsu Limited, Kawasaki, Japan

[21] Appl. No.: 09/131,697

[22] Filed: Aug. 10, 1998

[30] Foreign Application Priority Data

Feb. 12, 1998  [JP]  Japan .................................. 10-029553

[51] Int. Cl.⁷ .............................. H01S 3/04; H01S 3/10; H01S 3/19
[52] U.S. Cl. .................... 372/34; 372/20; 372/50
[58] Field of Search ............................... 372/20, 23, 34, 372/50, 68

[56] References Cited

U.S. PATENT DOCUMENTS 5,202,893  4/1993  Kubota et al. .............................. 372/34
5,402,436  3/1995  Paoli ........................................... 372/50

FOREIGN PATENT DOCUMENTS 56-55087   5/1981   Japan .
6-112570   4/1994   Japan .
6-125138   5/1994   Japan .
8-46593    2/1996   Japan .
8-316575   11/1996  Japan .
9-64447    3/1997   Japan .

*Primary Examiner*—Frank G. Font
*Assistant Examiner*—Armando Rodriguez
*Attorney, Agent, or Firm*—Staas & Halsey LLP

[57] ABSTRACT

A multiwavelength light source for emitting light having multiple wavelengths. The multiwavelength light source includes a carrier and a laser diode array mounted on the carrier. The laser diode array is formed by integrating a plurality of laser diodes having substantially the same oscillation wavelength. The multiwavelength light source further includes a first temperature control device connected to the first end portion of the carrier and a second temperature control device connected to the second end portion of the carrier. The temperature of the first temperature control device is controlled to a first temperature, and the temperature of the second temperature control device is controlled to a second temperature different from the first temperature. The first and second temperature control devices produce a given temperature gradient in the carrier over its entire width from the first end portion to the second end portion to thereby oscillate the plural laser diodes with a desired wavelength spacing.

8 Claims, 8 Drawing Sheets

MULTIWAVELENGTH LIGHT SOURCE

BACKGROUND OF THE INVENTION

1. Field of the Invention

The present invention relates to a multiwavelength light source for emitting light having multiple wavelengths.

2. Description of the Related Art

In a recent optical communication system, increasing a communication capacity has been tried by applying high-density wavelength division multiplexing. High-density wavelength division multiplexing optical communication requires a multiwavelength light source for emitting light having multiple wavelengths spaced a distance as very short as 1 nm or less, and accordingly a very high spectral accuracy is required. At present, size reduction of a light source for wavelength division multiplexing optical communication is required. The present invention is a technique for realizing oscillation at wavelengths with an accurate spacing in a laser diode array module to thereby realize a small-sized multiwavelength light source.

Conventionally, a multiwavelength light source is realized generally by using multiple light sources having different oscillation wavelengths. However, with this configuration using such multiple light sources, a very large installation space is necessary, and temperature control of the multiple light sources must be individually performed, causing a great increase in scale of the multiwavelength light source. As another multiwavelength light source recently researched, the refractive index and period of each grating of a DFB (distributed feedback) laser diode array or DBR (distributed Bragg reflector) laser diode array are changed to oscillate laser diodes constituting the array at different wavelengths.

Further, a multiwavelength surface-emitting laser array formed by integrating lasers oscillating at different wavelengths is disclosed in U.S. Pat. No. 5,029,176. The oscillation wavelength of a surface-emitting laser is determined by the resonant wavelength of a vertical cavity, and the resonant wavelength is determined by a cavity length. Accordingly, by inclining the thickness of each layer constituting the surface-emitting laser in an in-plane direction, it is possible to simultaneously form lasers having different oscillation wavelengths.

Although the multiwavelength light source obtained by changing the refractive index and period of each grating of the DFB laser diode array or DBR laser diode array has a small size, the wavelength spacing in the array is affected by a refractive index distribution during manufacture, thus presenting a problem in manufacturability. Further, the multiwavelength surface-emitting laser array disclosed in U.S. Pat. No. 5,029,176 also has a problem in manufacturability because the surface-emitting laser itself is difficult to manufacture.

SUMMARY OF THE INVENTION

It is therefore an object of the present invention to provide a multiwavelength light source having a small size and a high spectral accuracy.

In accordance with an aspect of the present invention, there is provided a multiwavelength light source for emitting light having multiple wavelengths, comprising a carrier having a first end portion and a second end portion; a laser diode array mounted on the carrier, the laser diode array being formed by integrating a plurality of laser diodes having substantially the same oscillation wavelength; a first temperature control device operatively connected to the first end portion of the carrier, the temperature of the first temperature control device being controlled to a first temperature; and a second temperature control device operatively connected to the second end portion of the carrier, the temperature of the second temperature control device being controlled to a second temperature different from the first temperature; whereby a given temperature gradient is produced in the carrier over its entire width from the first end portion to the second end portion to thereby oscillate the plurality of laser diodes with a given wavelength spacing.

Preferably, the carrier has a radiation characteristic as the inverse function of a function defining the given temperature gradient. Accordingly, the temperature gradient in the carrier can be made linear to thereby make the wavelength spacing uniform.

In accordance with another aspect of the present invention, there is provided a multiwavelength light source in which a laser diode array formed by integrating a plurality of laser diodes having different oscillation wavelengths is mounted on the carrier, and the temperature of the carrier is controlled by the first temperature control device and the second temperature control device. When a temperature gradient is given to the laser diode array by the first and second temperature control devices, the oscillation wavelength of each laser diode is shifted according to a temperature change, so that the wavelength spacing in the laser diode array can be increased or decreased. By controlling the first and second temperature control devices to adjust the temperature gradient, the wavelength spacing can be controlled to thereby obtain a desired wavelength spacing.

In accordance with a further aspect of the present invention, there is provided a multiwavelength light source for emitting light having multiple wavelengths, comprising a carrier having a first end portion and a second end portion; a laser diode array mounted on an upper surface of the carrier, the laser diode array being formed by integrating a plurality of laser diodes having substantially the same oscillation wavelength; and a plurality of temperature control devices provided on a lower surface of the carrier at substantially equal intervals, the temperatures of the plurality of temperature control devices being controlled to substantially equally spaced temperatures; whereby a linear temperature gradient is produced in the carrier over its entire width from the first end portion to the second end portion to thereby oscillate the plurality of laser diodes with a substantially uniform wavelength spacing.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
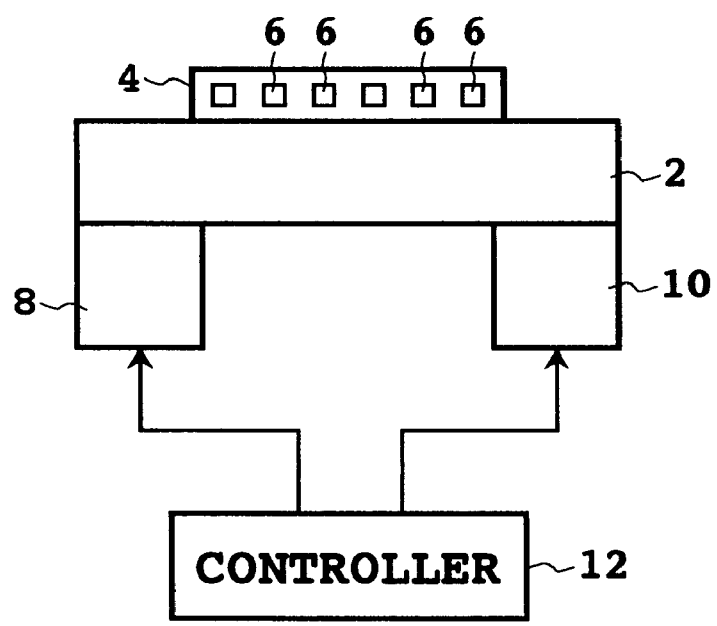
FIG. 1 is a schematic elevational view showing the principle of the present invention.

The principle of the present invention will first be described with reference to FIGS. 1 and 2A to 2C. A laser diode array 4 formed by integrating a plurality of laser diodes 6 having substantially the same oscillation wavelength is mounted on a carrier 2. The carrier 2 has a first end portion mounted on a first temperature control device 8 and a second end portion mounted on a second temperature control device 10. The temperature of the first temperature control device 8 is controlled to a first temperature by a controller 12, and the temperature of the second temperature control device 10 is controlled to a second temperature higher than the first temperature by the controller 12.

Figure 2A:
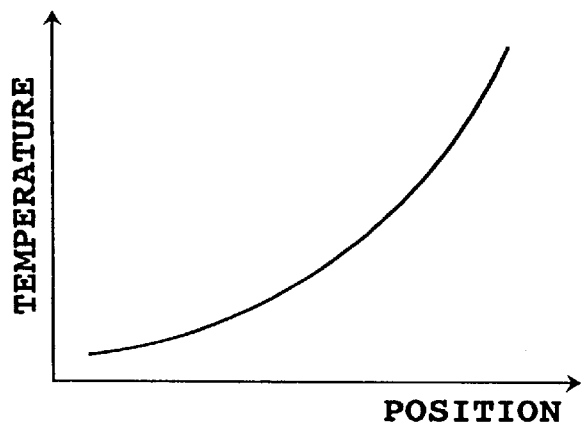
FIG. 2A is a graph showing the relation between position and temperature in a carrier in the case that the carrier has a uniform radiation characteristic.
Figure 2B:
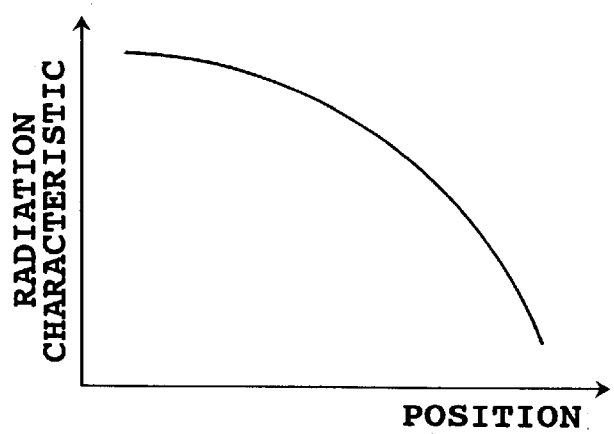
FIG. 2B is a graph showing a radiation characteristic of the carrier changed so that the radiation characteristic becomes the inverse function of a function defining the curve shown in FIG. 2A.
Figure 2C:
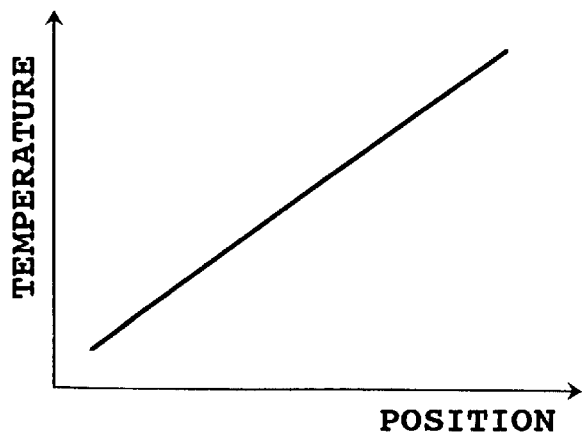
FIG. 2C is a graph showing a temperature gradient produced in the carrier having the radiation characteristic shown in FIG. 2B.

The oscillation or lasing wavelength of a laser diode shifts in proportion to a temperature change. Accordingly, the laser diodes 6 oscillate at different wavelengths according to their temperatures, and it is possible to realize the laser diode array 4 in which the oscillation wavelength gradually changes from one end of the array 14 to the other end thereof. Assuming that the carrier 2 has a fixed radiation characteristic over its entire width, the temperature gradient in the carrier 2 is not linear, but changes along a certain curve as shown in FIG. 2A. Accordingly, by making the carrier 2 have a radiation characteristic as the inverse function of a function defining the above temperature change as shown in FIG. 2B, the temperature gradient in the carrier 2 can be made linear as shown in FIG. 2C. As a result, the wavelength spacing in the laser diode array 4 can be made uniform.

The laser diode array 4 may be formed by integrating a plurality of laser diodes having different oscillation wavelengths. For example, by changing the refractive index and period of each grating portion of a DFB laser diode array, it is possible to realize a laser diode array oscillating at a wavelength gradually changing from one end of the array to the other end thereof. In this case, the wavelength spacing in the DFB laser diode array varies because of deviations of the refractive index distribution of each grating portion during manufacture. By giving a temperature distribution to this laser diode array, the wavelength shift due to a temperature change is produced to thereby allow an increase or decrease in the wavelength spacing. By adjusting the temperature gradient in the carrier, that is, the temperature gradient in the laser diode array, the wavelength spacing can be controlled to thereby obtain a desired wavelength spacing. In the case that the laser diodes of the laser diode array oscillate at different wavelengths, a temperature difference between the first and second temperature control devices 8 and 10 at the opposite end portions of the carrier 2 can be reduced.

Figure 3A:
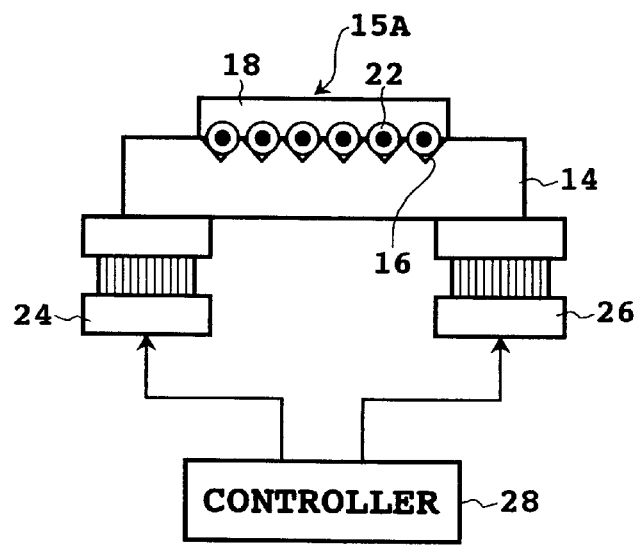
FIG. 3A is a schematic elevational view of a laser diode array module showing a first preferred embodiment of the present invention.
Figure 3B:
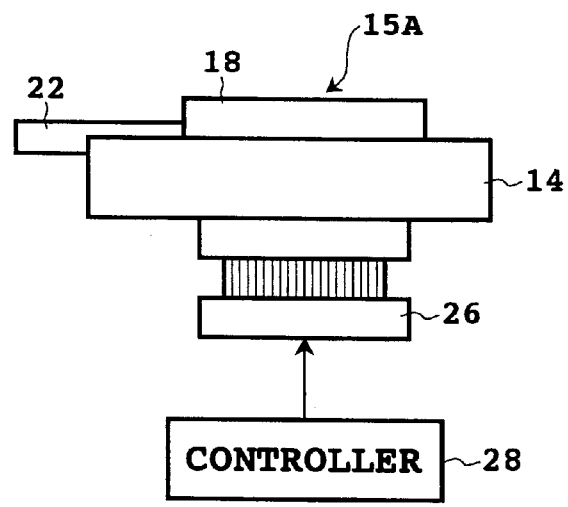
FIG. 3B is a side view of FIG. 3A.
Figure 4:
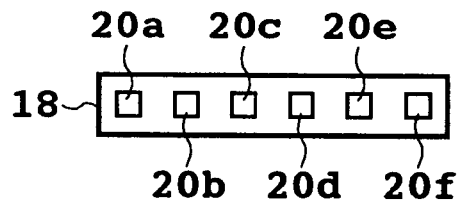
FIG. 4 is a schematic elevational view of a laser diode array shown in FIG. 3A.

FIG. 3A is a schematic elevational view of a laser diode array module 15A showing a first preferred embodiment of the present invention, and FIG. 3B is a side view of FIG. 3A. In the following description of each preferred embodiment, substantially the same parts are denoted by the same reference numerals. A plurality of V-grooves 16 are formed on the upper surface of a carrier 14. A laser diode array 18 formed by integrating a plurality of laser diodes 20a, 20b, 20c, 20d, 20e, and 20f (see FIG. 4) having substantially the same oscillation wavelength is mounted on the upper surface of the carrier 14.

A plurality of optical fibers 22 are received in the plural V-grooves 16 of the carrier 14, respectively, and the end faces of the plural optical fibers 22 are optically coupled to the plural laser diodes 20a to 20f, respectively. The carrier 14 is mounted at its opposite end portions on Peltier devices 24 and 26. A controller 28 is connected to the Peltier devices 24 and 26 to control the temperature of a contact portion between the Peltier device 24 and the carrier 14 to a first temperature and the temperature of a contact portion between the Peltier device 26 and the carrier 14 to a second temperature higher than the first temperature. Assuming that the radiation characteristic of the carrier 14 is uniform over its entire width, a temperature gradient as shown in FIG. 2A is produced from one end of the carrier 14 to the other end thereof, thereby producing a similar temperature gradient in the laser diode array 18.

The oscillation wavelength of a laser diode shifts in proportion to a temperature change as mentioned above. Accordingly, the laser diodes 20a to 20f oscillate at different wavelengths according to their temperatures, thereby providing the laser diode array 18 whose oscillation wavelength gradually changes from one end of the array 18 to the other end thereof. Preferably, the carrier 14 is formed of silicon (Si) or ceramics, for example. Accordingly, by making the carrier 14 have a radiation characteristic as shown in FIG. 2B, the carrier 14 has a linear temperature gradient as shown in FIG. 2C, thereby making the wavelength spacing in the laser diode array 18 uniform.

Figure 5:
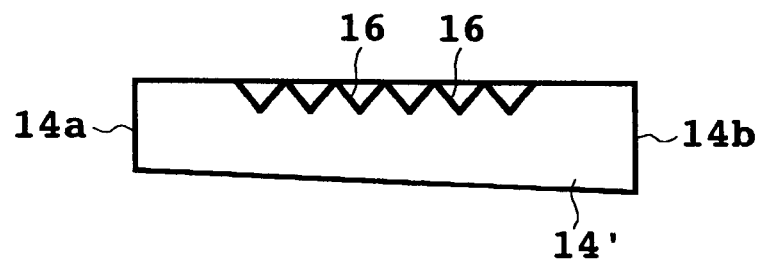
FIG. 5 is a schematic elevational view of a carrier having a radiation characteristic distribution.

FIG. 5 shows a carrier 14' capable of realizing such a uniform wavelength spacing. The carrier 14' is formed of silicon, for example, and has a thickness gradually increasing from one end 14a to another end 14b. In the carrier 14', an end portion near the one end 14a having a smaller thickness has a smaller heat capacity, and another end portion near the other end 14b having a larger thickness has a larger heat capacity. Therefore, the end portion near the one end 14a has a larger radiation characteristic, and the other end portion near the other end 14b has a smaller radiation characteristic, thus realizing a radiation characteristic as shown in FIG. 2B.

Figure 6:
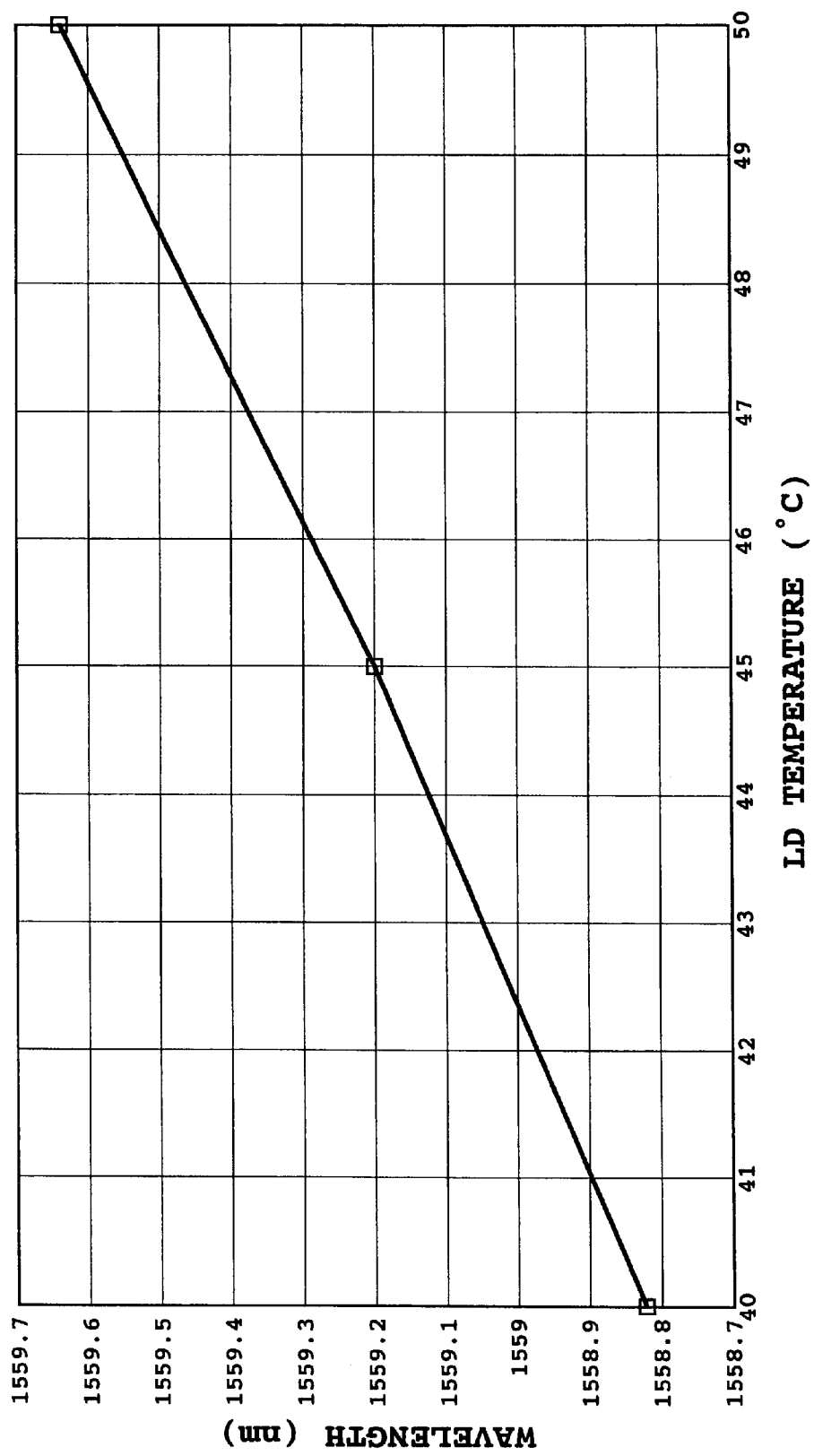
FIG. 6 is a graph showing a temperature dependence of laser oscillation wavelength.

Referring to FIG. 6, there is shown a temperature dependence of laser oscillation wavelength. It is understood from FIG. 6 that by heating the laser diodes 20a, 20b, 20c, 20d, 20e, and 20f of the laser diode array 18 shown in FIG. 4 to 44° C., 45° C., 46° C., 47° C., 48° C. and 49° C., respectively, the oscillation wavelengths of the laser diodes 20a, 20b, 20c, 20d, 20e, and 20f become 1559.12 nm, 1559.20 nm, 1559.28 nm, 1559.36 nm, 1559.45 nm, and 1559.54 nm, respectively.

Figure 7A:
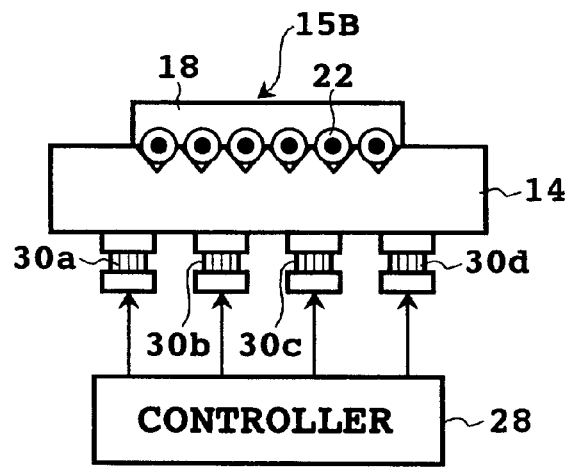
FIG. 7A is a schematic elevational view of a laser diode array module showing a second preferred embodiment of the present invention.
Figure 7B:
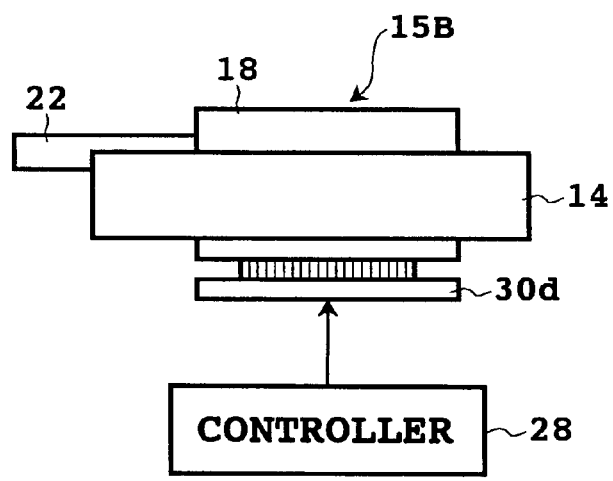
FIG. 7B is a side view of FIG. 7A.

FIG. 7A is a schematic elevational view of a laser diode array module 15B showing a second preferred embodiment of the present invention, and FIG. 7B is a side view of FIG. 7A. In this preferred embodiment, a plurality of Peltier devices 30a, 30b, 30c, and 30d are arranged at equal intervals, and a carrier 14 having a uniform radiation characteristic is mounted on the Peltier devices 30a to 30d. According to this preferred embodiment, the temperature of a contact portion between each of the Peltier devices 30a to 30d and the carrier 14 can be controlled by a controller 28 so that a linear temperature gradient is obtained in the carrier 14. Thus, although the carrier 14 has a uniform radiation characteristic, a linear temperature gradient is produced in the carrier 14. Accordingly, the temperature gradient in the laser diode array 18 can be made linear, thereby making the wavelength spacing in the laser diode array 18 uniform.

Figure 8A:
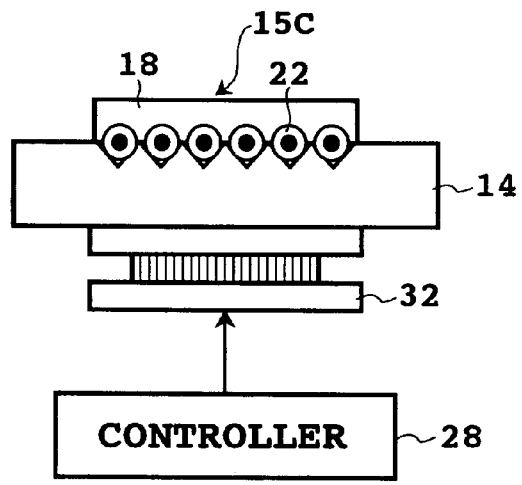
FIG. 8A is a schematic elevational view of a laser diode array module showing a third preferred embodiment of the present invention.
Figure 8B:
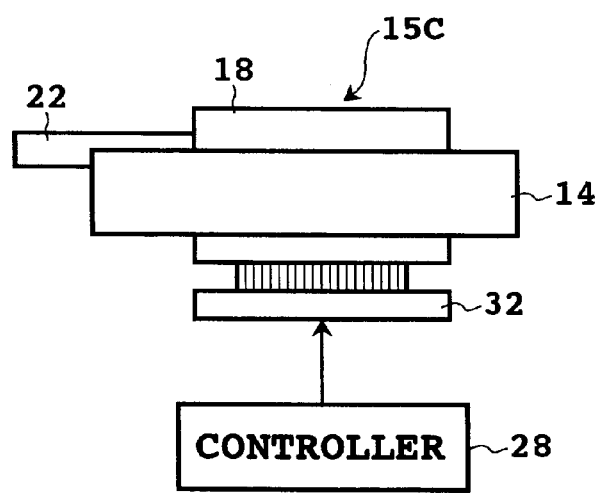
FIG. 8B is a side view of FIG. 8A.

FIG. 8A is a schematic elevational view of a laser diode array module 15C showing a third preferred embodiment of the present invention. In this preferred embodiment, a carrier 14 having a uniform radiation characteristic is mounted on a Peltier device array 32. The Peltier device array 32 is formed by integrating a plurality of Peltier devices in the form of array. Each Peltier device is controlled by a controller 28 to give a linear temperature gradient to the carrier 14. Accordingly, the wavelength spacing in the laser diode array 18 can be made uniform like the second preferred embodiment.

As a modification of the second or third preferred embodiment, a laser diode array formed by integrating a plurality of laser diodes having different oscillation wavelengths may be mounted on the carrier 14. In this case, each of the Peltier devices 30a to 30d or the Peltier device array 32 is controlled by the controller 28 so that the carrier 14 has a given temperature gradient, thereby uniforming the wavelength spacing in the laser diode array.

Figure 9:
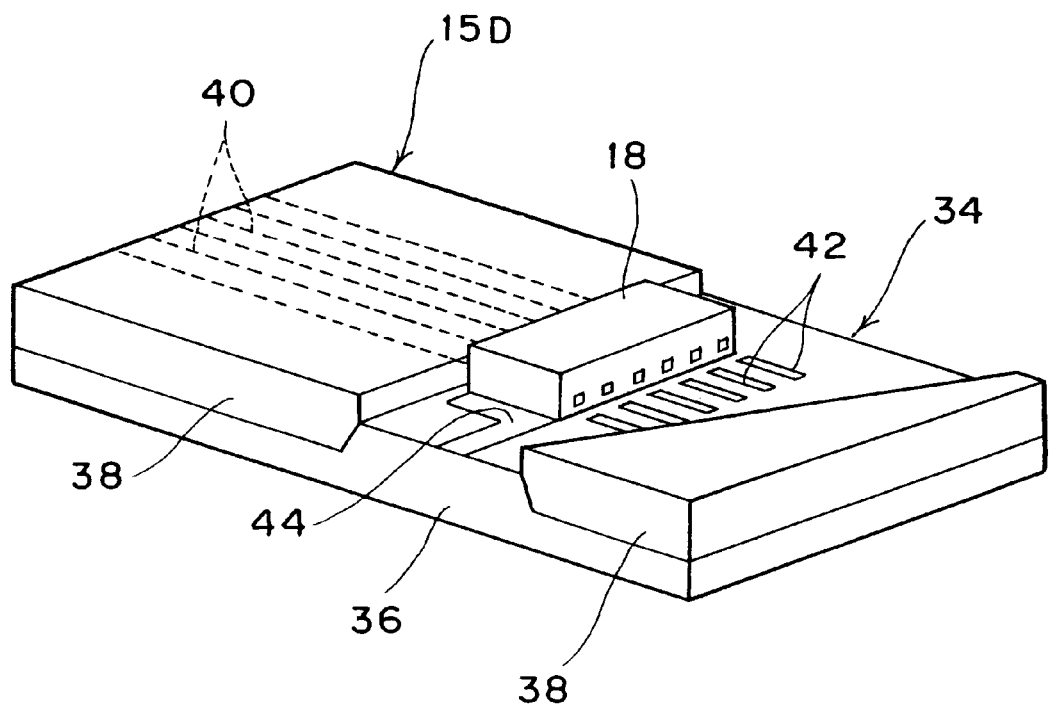
FIG. 9 is a schematic perspective view of a laser diode array module showing a fourth preferred embodiment of the present invention.

FIG. 9 is a perspective view of a laser diode array module 15D showing a fourth preferred embodiment of the present invention. In this preferred embodiment, the laser diode array module 15D also has Peltier devices which are not shown. A carrier 34 formed from a Si substrate 36 is used. An $SiO_2$ layer 38 is formed on the Si substrate 36 so that the upper surface of the Si substrate 36 is partially exposed. Six optical waveguides 40 are formed in the $SiO_2$ layer 38. A laser diode array 18 formed by integrating six laser diodes is mounted on an exposed portion of the upper surface of the Si substrate 36 in such a manner that the six laser diodes are optically coupled to the six optical waveguides 40, respectively.

Further, six drive electrodes 42 and a ground electrode 44 are formed on the exposed portion of the upper surface of the Si substrate 36 in such a manner that the six drive electrodes 42 respectively correspond to the six laser diodes. The exposed portion of the upper surface of the Si substrate 36 has a width gradually increasing from one end of the exposed portion to the other end thereof. An end portion near the narrower one end has a larger heat capacity, and another end portion near the wider other end has a smaller heat capacity, thereby making the carrier 34 have a radiation characteristic distribution as shown in FIG. 2B.

Accordingly, a linear temperature gradient as shown in FIG. 2C can be produced in the carrier 34 irrespective of the fact that the Si substrate 36 has a uniform radiation characteristic, thereby uniforming the wavelength spacing in the laser diode array 18. According to the present invention as described above, it is possible to provide an inexpensive multiwavelength light source having a small size and a high spectral accuracy.

What is claimed is:

1. A multiwavelength light source for emitting light having multiple wavelengths, comprising:
    a carrier having a first end portion and a second end portion;
    a laser diode array mounted on said carrier, said laser diode array being formed by integrating a plurality of laser diodes having substantially the same oscillation wavelength;
    a first temperature control device operatively connected to said first end portion of said carrier, the temperature of said first temperature control device being controlled to a first temperature; and
    a second temperature control device operatively connected to said second end portion of said carrier, the temperature of said second temperature control device being controlled to a second temperature different from said first temperature;
    whereby a given temperature gradient is produced in said carrier over its entire width from said first end portion to said second end portion to thereby oscillate said plurality of laser diodes with a given wavelength spacing.

2. A multiwavelength light source according to claim 1, wherein said carrier has a radiation characteristic as the inverse function of a function defining said given temperature gradient.

3. A multiwavelength light source for emitting light having multiple wavelengths, comprising:
    a carrier having a first end portion and a second end portion;
    a laser diode array mounted on said carrier, said laser diode array being formed by integrating a plurality of laser diodes having different oscillation wavelengths;
    a first temperature control device operatively connected to said first end portion of said carrier, the temperature of said first temperature control device being controlled to a first temperature; and
    a second temperature control device operatively connected to said second end portion of said carrier, the temperature of said second temperature control device being controlled to a second temperature different from said first temperature;
    whereby a given temperature gradient is produced in said carrier over its entire width from said first end portion to said second end portion to thereby oscillate said plurality of laser diodes with a substantially uniform wavelength spacing.

4. A multiwavelength light source according to claim 3, wherein said carrier has a radiation characteristic as the inverse function of a function defining said given temperature gradient.

5. A multiwavelength light source according to claim 3, wherein said laser diode array has an oscillation wavelength spacing according to a certain function, and said given temperature gradient is a temperature gradient as the inverse function of said certain function.

6. A multiwavelength light source according to claim 5, wherein said certain function is substantially given as a logarithmic function, and said temperature gradient is substantially given as an exponential temperature gradient.

7. A multiwavelength light source for emitting light having multiple wavelengths, comprising:

a carrier having a first end portion and a second end portion;

a laser diode array mounted on an upper surface of said carrier, said laser diode array being formed by integrating a plurality of laser diodes having substantially the same oscillation wavelength; and a plurality of temperature control devices provided on a lower surface of said carrier at substantially equal intervals, the temperatures of said plurality of temperature control devices being controlled to substantially equally spaced temperatures;

whereby a linear temperature gradient is produced in said carrier over its entire width from said first end portion to said second end portion to thereby oscillate said plurality of laser diodes with a substantially uniform wavelength spacing.

8. A multiwavelength light source for emitting light having multiple wavelengths, comprising:

a carrier having a first end portion and a second end portion;

a laser diode array mounted on an upper surface of said carrier, said laser diode array being formed by integrating a plurality of laser diodes having different oscillation wavelengths; and a plurality of temperature control devices provided on a lower surface of said carrier at substantially equal intervals, the temperatures of said plurality of temperature control devices being controlled to a given temperature;

whereby a given temperature gradient is produced in said carrier over its entire width from said first end portion to said second end portion to thereby oscillate said plurality of laser diodes with a substantially uniform wavelength spacing.

* * * * *